United States Patent
Matsumoto et al.

(10) Patent No.: US 10,212,849 B2
(45) Date of Patent: Feb. 19, 2019

(54) LIQUID IMMERSION TANK, AND APPARATUS INCLUDING LIQUID IMMERSION TANK

(71) Applicant: FUJITSU LIMITED, Kawasaki-shi, Kanagawa (JP)

(72) Inventors: Yoshio Matsumoto, Kawasaki (JP); Hideo Kubo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 11 days.

(21) Appl. No.: 15/641,669

(22) Filed: Jul. 5, 2017

(65) Prior Publication Data

US 2018/0084671 A1    Mar. 22, 2018

Related U.S. Application Data

(63) Continuation of application No. PCT/JP2016/077527, filed on Sep. 16, 2016.

(51) Int. Cl.
*H05K 7/20* (2006.01)

(52) U.S. Cl.
CPC ..... *H05K 7/20236* (2013.01); *H05K 7/20272* (2013.01); *H05K 7/20772* (2013.01)

(58) Field of Classification Search
None
See application file for complete search history.

(56) References Cited

U.S. PATENT DOCUMENTS

| | | | | |
|---|---|---|---|---|
| 2007/0267741 | A1* | 11/2007 | Attlesey | G06F 1/20 257/714 |
| 2009/0260777 | A1 | 10/2009 | Attlesey | |
| 2009/0317698 | A1* | 12/2009 | Murata | H01M 2/1077 429/62 |
| 2010/0226094 | A1* | 9/2010 | Attlesey | H05K 7/20772 361/699 |

(Continued)

FOREIGN PATENT DOCUMENTS

| | | |
|---|---|---|
| JP | 04-279098 A | 10/1992 |
| JP | 10-097347 A | 4/1998 |

(Continued)

OTHER PUBLICATIONS

International Search Report & Written Opinion dated Nov. 29, 2016 corresponding to International Patent Application No. PCT/JP2016/077527, and English translation thereof.

(Continued)

*Primary Examiner* — Courtney Smith
(74) *Attorney, Agent, or Firm* — Fujitsu Patent Center

(57) ABSTRACT

The present application discloses a liquid immersion tank capable of withstanding, though made of a resin, a load of coolants and keeping dimensional accuracy. The liquid immersion tank including: a tank body being receivable of an electronic equipment and filled with a fluorine-series insulating coolant; and a fixing portion being provided on an inner wall surface of the tank body and receiving fixation of the electronic equipment, the tank body being equal to or smaller than 2% in modulus of volume change when (Continued)

immersed in the fluorine-series insulating coolant, and being composed of a resin material being equal to or smaller than $15 \times 10^{-5}$/K in coefficient of linear expansion.

8 Claims, 6 Drawing Sheets

(56) References Cited

U.S. PATENT DOCUMENTS

| | | | |
|---|---|---|---|
| 2014/0355212 A1* | 12/2014 | Campbell | H05K 7/20236 361/699 |
| 2015/0043165 A1* | 2/2015 | Best | H05K 7/20763 361/699 |
| 2015/0319889 A1 | 11/2015 | Flory et al. | |
| 2016/0234970 A1* | 8/2016 | Shelnutt | H05K 7/20809 |
| 2016/0240226 A1* | 8/2016 | Shelnutt | G06F 1/206 |
| 2017/0156233 A1* | 6/2017 | Moss | H05K 7/20818 |
| 2017/0265328 A1* | 9/2017 | Sasaki | H05K 7/20236 |
| 2017/0265336 A1* | 9/2017 | Ichinose | H05K 7/20772 |
| 2017/0280587 A1* | 9/2017 | Watanabe | H05K 7/20272 |
| 2017/0295676 A1* | 10/2017 | Conn | H05K 7/20781 |

FOREIGN PATENT DOCUMENTS

| | | |
|---|---|---|
| JP | 2000-349480 A | 12/2000 |
| JP | 2010-063195 A | 3/2010 |
| JP | 2011-518395 A | 6/2011 |
| JP | 2013-187251 A | 9/2013 |
| JP | 2015-133384 A | 7/2015 |
| JP | 2016-046431 A | 4/2016 |
| JP | 2016-513304 A | 5/2016 |
| JP | 5956098 B1 | 7/2016 |
| WO | WO 2016/088280 A1 | 6/2016 |

OTHER PUBLICATIONS

Decision to Grant a Patent dated Aug. 29, 2017 corresponding to Japanese Patent Application No. 2017-528228.

\* cited by examiner

TEST RESULT

| RESIN MATERIAL | GENERAL DETERMINATION |
|---|---|
| PVC (HARD) | ○ |
| PE | ○ |
| PTFE | × |
| FEP | × |

…

LIQUID IMMERSION TANK, AND APPARATUS INCLUDING LIQUID IMMERSION TANK

CROSS-REFERENCE TO RELATED APPLICATION

This application is a continuation application of International Application PCT/JP2016/77527 filed on Sep. 16, 2016 and designated the U.S., the entire contents of which are incorporated herein by reference.

FIELD

The present application pertains to a liquid immersion tank, and an apparatus having the liquid immersion tank.

BACKGROUND

An electronic equipment uses a variety of cooling means (refer to, e.g., Patent Document 1).

PATENT DOCUMENT

[Patent Document 1] Japanese Patent No. 5853072

SUMMARY

A liquid immersion tank disclosed in the present application includes: a tank body being receivable of an electronic equipment and filled with a fluorine-series insulating coolant; and a fixing portion being provided on an inner wall surface of the tank body and receiving fixation of the electronic equipment, the tank body being equal to or smaller than 2% in modulus of volume change when immersed in the fluorine-series insulating coolant, and being composed of a resin material being equal to or smaller than $15 \times 10^{-5}$/K in coefficient of linear expansion.

An apparatus having a liquid immersion tank, which is disclosed in the present application, includes: an electronic equipment; a tank body receiving an electronic equipment and filled with a fluorine-series insulating coolant; and a fixing portion being provided on an inner wall surface of the tank body and receiving fixation of the electronic equipment, the tank body being equal to or smaller than 2% in modulus of volume change when immersed in the fluorine-series insulating coolant, and being composed of a resin material being equal to or smaller than $15 \times 10^{-5}$/K in coefficient of linear expansion.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

An embodiment will hereinafter be described. The embodiment to be illustrated below is a mere exemplification, and a technical scope of the present disclosure is not limited to the following mode.

Figure 1:
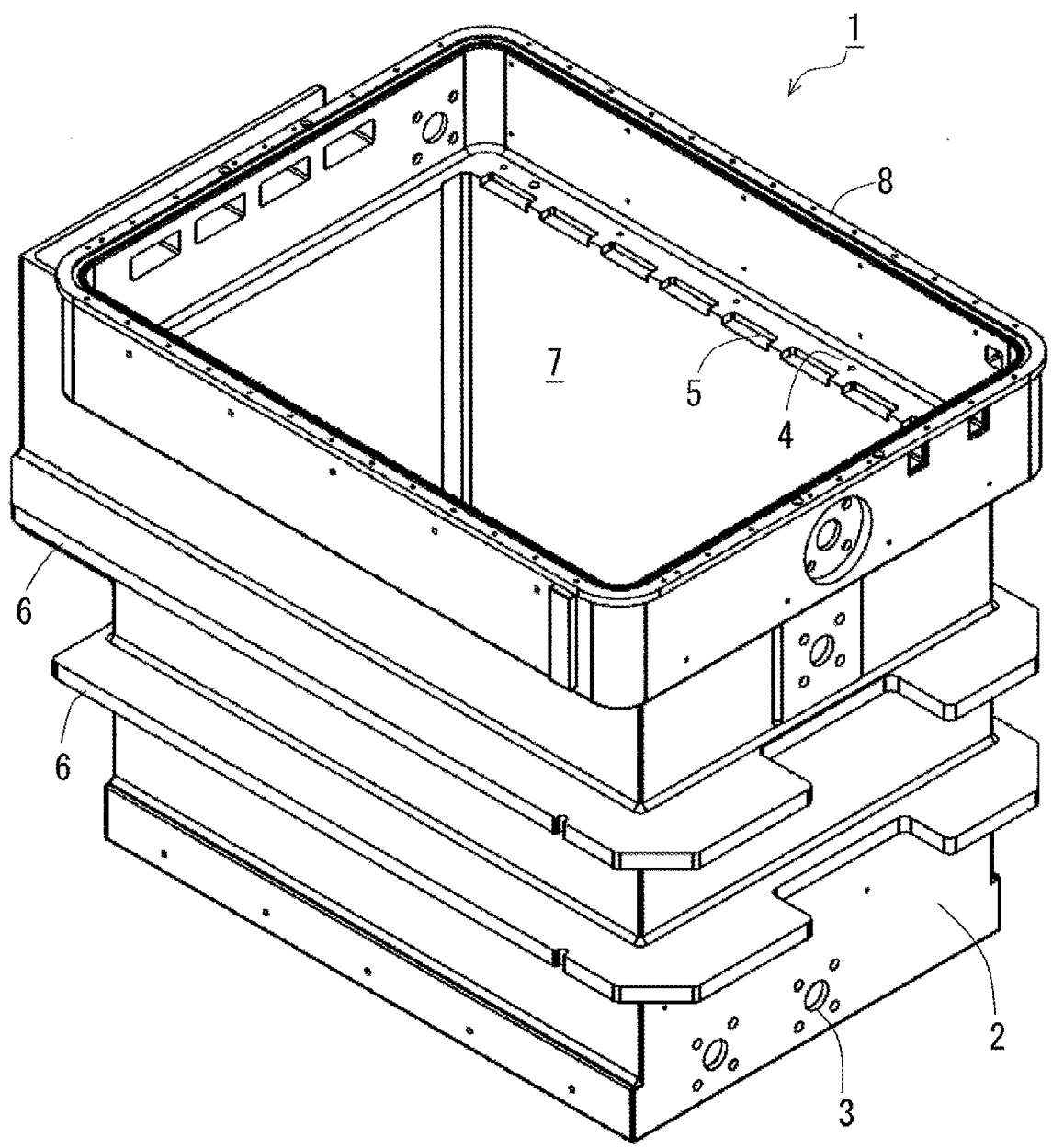
FIG. 1 is a first perspective view illustrating a liquid immersion tank of an electronic equipment according an embodiment.
Figure 2:
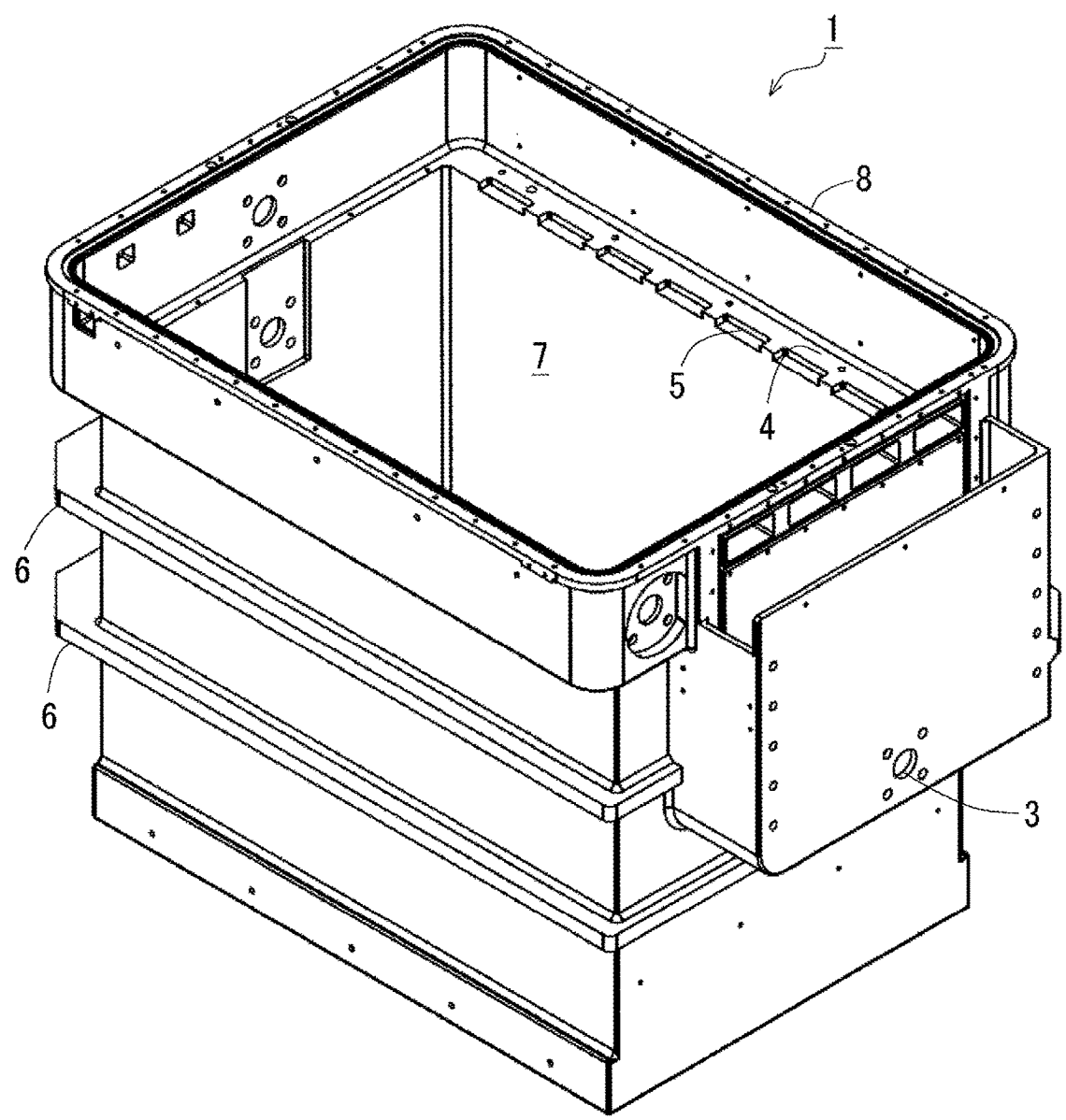
FIG. 2 is a second perspective view illustrating the liquid immersion tank of the electronic equipment according to the embodiment as viewed from a direction opposite to the first perspective view.

FIG. 1 is a first perspective view depicting a liquid immersion tank of an electronic equipment according to the embodiment. FIG. 2 is a second perspective view illustrating the liquid immersion tank of the electronic equipment according to the embodiment as viewed from a direction opposite to the first perspective view. A liquid immersion tank 1 includes a resin-made tank body 2 containing a liquid coolant. The tank body 2 receives the electronic equipment immersed in the liquid coolant. The electronic equipment is an equipment that is preferable to be cooled during an operation. Applicable to the electronic equipment are servers, databases, communication equipments, electronic equipments for medical treatments and for various types of experimental equipments, and a variety of other electronic equipments. The tank body 2 is provided, in a proper position, with a connection port 3 of establishing a connection to a circulation path attached with a pump for forcibly circulating the coolant inside and outside of the tank body 2.

An inner wall surface of the tank body 2 is provided with a stepped portion 4 for fixing the electronic equipment (the stepped portion being one example of a "fixing portion" defined according to the present application). The stepped portion 4 may be, because of the portion 4 being brought into contact with metallic components of the electronic equipment, configured as a metallic component embedded in or fitted to a resin composing the tank body 2, and may also be composed of the resin composing the tank body 2. The stepped portion 4 is formed with cavities 5 into which end portions of the electronic equipment are fitted. The cavities 5 are formed in two inner wall surfaces having a face-to-face relationship with each other within the tank body 2. The end portions of one electronic equipment are fitted into the couple of cavities 5. The couples of cavities 5 are formed corresponding to a number of electronic equipments receivable in the tank body 2.

An outer wall surface of the tank body 2 is provided with ribs 6 configured in a crosswise direction. The ribs 6 reinforce plate-like members building up the inner wall surfaces of the tank body 2, and restrain flexures of the inner wall surfaces of the tank body 2 from being caused to outward of the tank body 2. Note that FIGS. 1 and 2 illustrate the two ribs 6 in parallel on the outer wall surface of the tank body 2. However, a number and a configuration of the ribs 6 may be properly changed. The ribs 6 may be omitted, as far as the plate-like members building up the wall surfaces of the tank body 2 have a proper strength.

An opening 7 formed at an upper portion of the tank body 2 includes a flange 8 for securing a cover fitted to the opening 7 in order to enable maintenance of the electronic equipment received in the tank body 2. Based on a premise that the tank body 2 is used as a cooling mechanism of a liquid cooling type not based on a premise of the coolant being boiled up, the tank body 2 does not have pressure resistance performance as instanced by a so-called pressure vessel. However, the opening 7 of the tank body 2 is normally closed by a hermetic cover to prevent the coolant from being volatilized.

Figure 3:
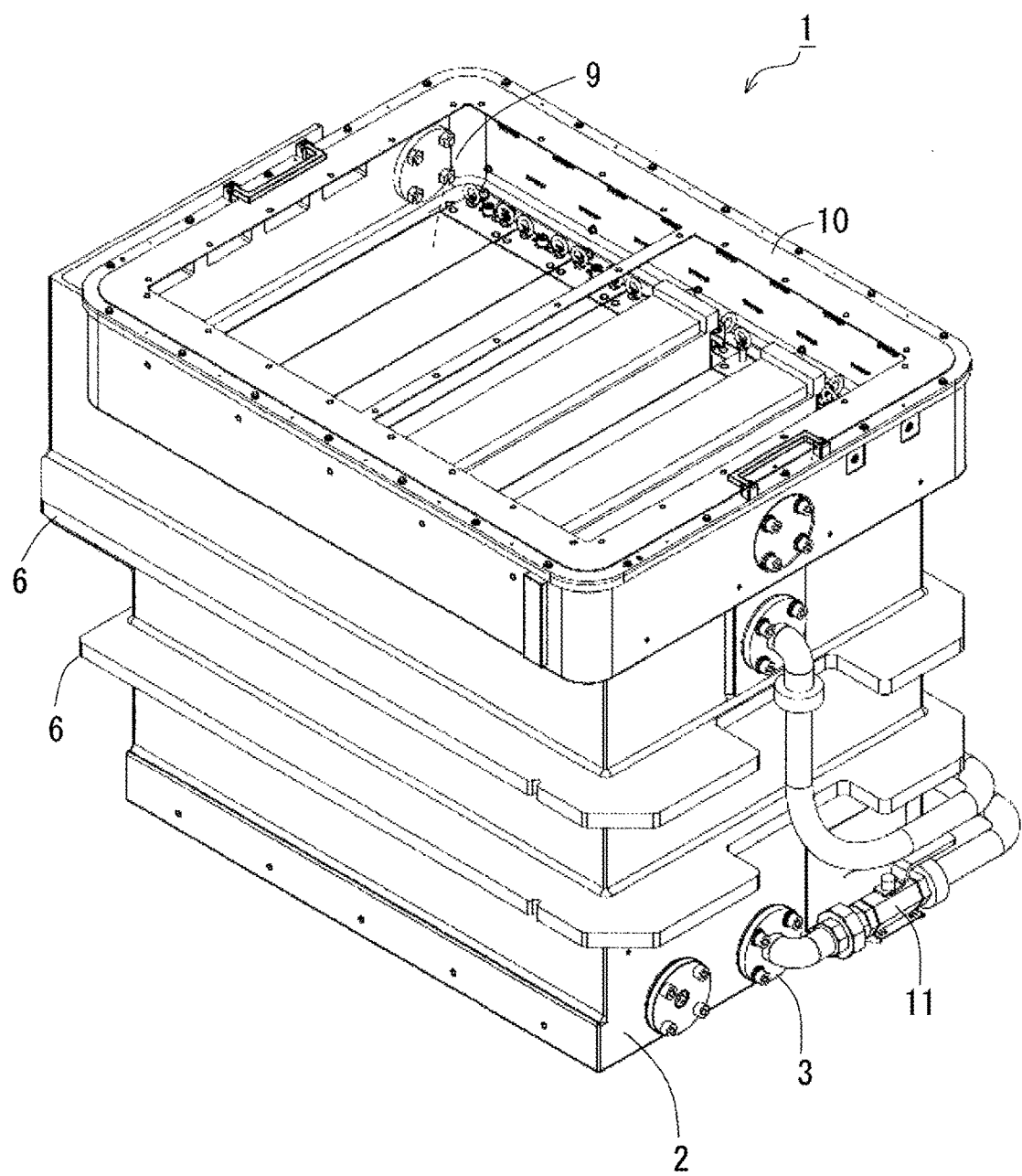
FIG. 3 is a view illustrating the liquid immersion tank in a state of receiving the electronic equipments.

FIG. 3 is a view illustrating the liquid immersion tank 1 in a state of receiving the electronic equipments. A plurality of electronic equipments 9 is received within the tank body 2 and fixed by screwed to the stepped portion 4. The opening 7 of the tank body 2 is tightly closed by a cover 10 instanced to have a window configured by a transparent plate. A pipe 11 of the circulation path for circulating the coolant filling an interior of the tank body 2 is connected to the connection port 3 of the tank body 2.

Figure 4:
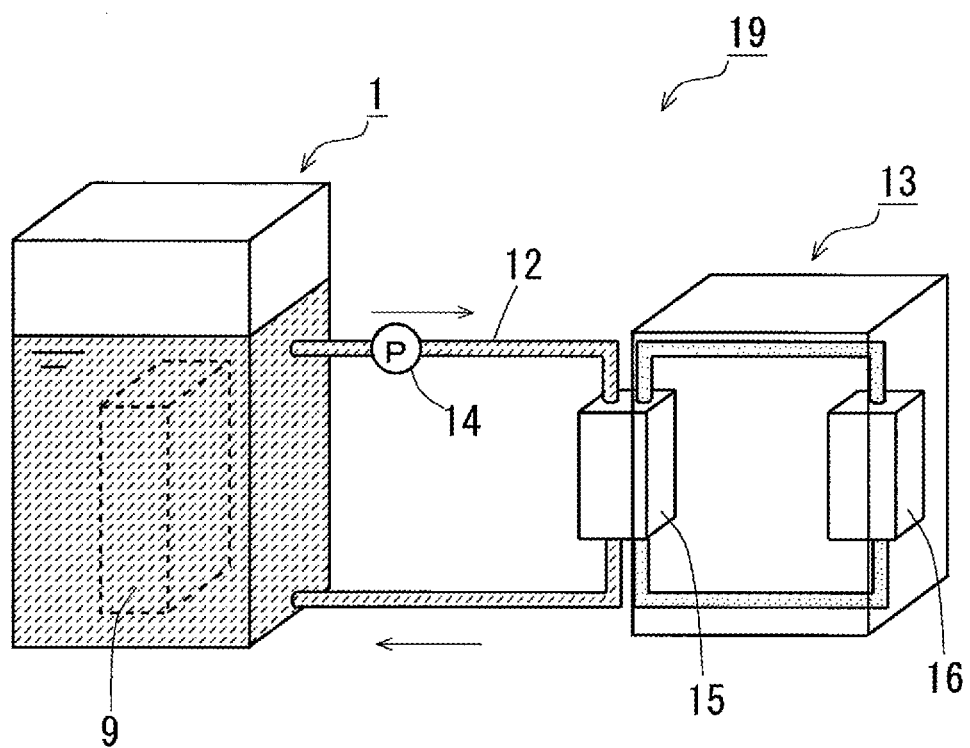
FIG. 4 is a view depicting a cooling system for the electronic equipments.

FIG. 4 is a view depicting a cooling system (which is one example of "an apparatus including a liquid immersion tank" defined by the present application) for the electronic equipments. A cooling system 19 includes the liquid immersion tank 1 receiving the electronic equipments 9, a circulation path 12 through which to circulate the coolant of the liquid immersion tank 1, and a chiller unit 13 to cool the coolant in the circulation path 12. The circulation path 12 is equipped with an electric motor pump 14 to forcibly circulate the coolant. The circulation path 12 is configured to pass through an inside of a tube of a heat exchanger 15 provided in the chiller unit 13. The chiller unit 13 has, in addition to the heat exchanger 15, a compressor 16 to form a refrigeration cycle, an unillustrated expansion valve and an unillustrated condenser.

Various types of liquids, each having an insulating property not causing an electric leak even when contacting a conductive member, are applicable as the coolant entering the liquid immersion tank 1 described above. However, fluorine-series insulating coolants being hard to remain in the electronic equipment are more desirable for the coolant entering the liquid immersion tank 1 than synthetic oil-series coolants when taking account of the maintenance and other equivalent works of the electronic equipment. The fluorine-series insulating coolants are instanced by a trade name "Fluorinert" (registered trademark) of 3M Company and a trade name "Galden" (registered trademark) of Solvay S.A. However, when trying to composing the tank body 2 by using the resin for decreasing a weight of the liquid immersion tank 1, it happens in some cases that the fluorine-series insulating coolants permeate into the resin, or resin components are eluted into the fluorine-series insulating coolants. The permeation of the fluorine-series insulating coolants into the resin causes an increase in volume of the tank body 2, and causes a decline of dimensional accuracy of the stepped portion 4 for fixing the electronic equipment 9 and other portions. The elution of the resin components into the fluorine-series insulating coolants causes a decrease in strength of the tank body 2.

Note that FIG. 4 illustrates the liquid immersion tank 1 and the chiller unit 13 one by one, the cooling system 19 may also, however, include proper numbers of liquid immersion tanks 1 and chiller units 13.

Figure 5:
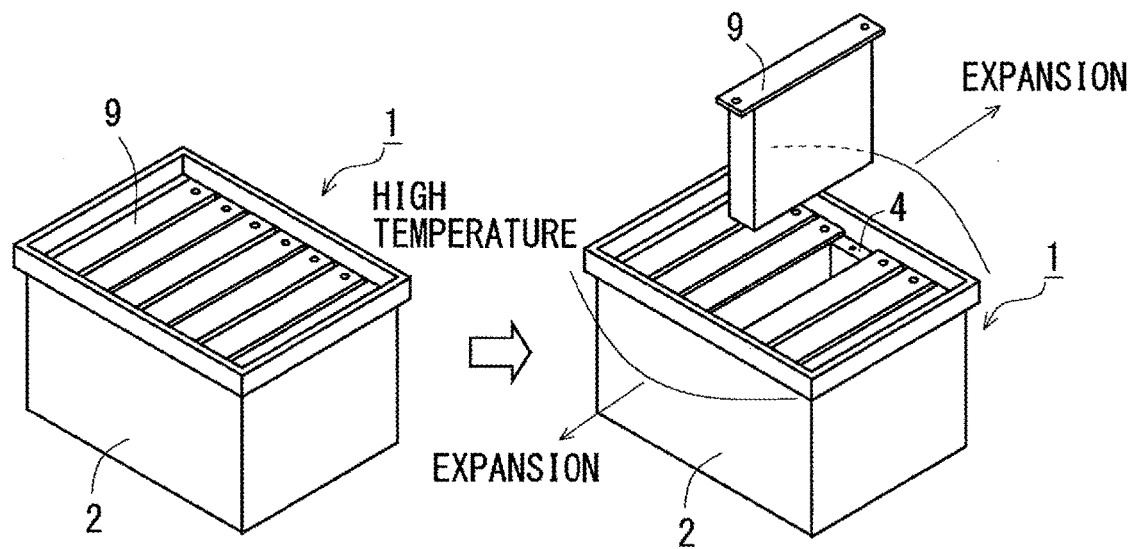
FIG. 5 is a view of imagining how physical properties of the tank body change due to permeation of fluorine-series insulating coolants and elution of resin components.

FIG. 5 is a view of imagining how physical properties of the tank body 2 change due to the permeation of the fluorine-series insulating coolants and the elution of the resin components. For example, the physical properties of the tank body 2 change due to the permeation of the fluorine-series insulating coolants and the elution of the resin components, in which case the plate-like members building up the wall surfaces of the tank body 2 are burdened with a load of the coolants, and therefore have an increased possibility of the outward flexures from the tank body 2 when a temperature of the liquid immersion tank 1 rises due to heat generated by the electronic equipments 9. When the tank body 2 becomes flexural, a change occurs in the dimension of the stepped portion 4 to which the electronic equipment is fixed, resulting in a possibility of causing a hindrance in alignment of the screws for fixing the electronic equipment. Such being the case, according to the embodiment, the tank body 2 is composed of the resin selected in conformity with the following standards.

Figure 6:
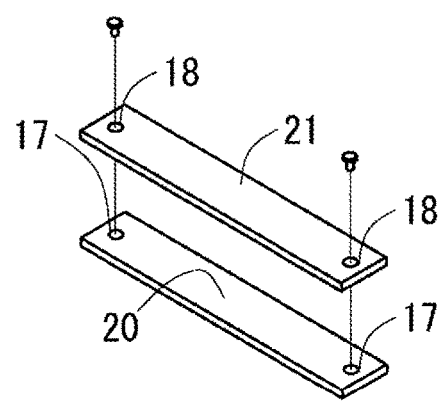
FIG. 6 is a view illustrating a method of checking the resin used for composing the tank body.

FIG. 6 is a view illustrating a method of checking the resin used for composing the tank body 2. The selection of the resin used for composing the tank body 2 involves preparing, as illustrated in FIG. 6, e.g., a metallic piece 20 of an electrogalvanized steel plate (SECC) simulating the electronic equipment, and a resin-made test piece 21 simulating the resin used for the tank body 2. The metallic piece 20 and the test piece 21 are formed with screw holes 17, 18 at an interval (e.g., 465 mm that is an interval of fixed holes of 19 in. rack as specified by Electronics Industries Association (EIA) of U.S.A.) matching with the two fixed holes formed in the fitting portion of the electronic equipment 9. The present check method involves performing an acceleration test corresponding to durability years (e.g., 5 years) of the liquid immersion tank 1 by heating the test piece 21 in a state of being immersed in the fluorine-series insulating coolants entering the liquid immersion tank 1. After the acceleration test, the test piece 21 is superposed on the metallic piece 20, thus checking whether the pieces 21, 20 can be assembled by the screws inserted into the holes 17, 18.

Figures 7, 8:
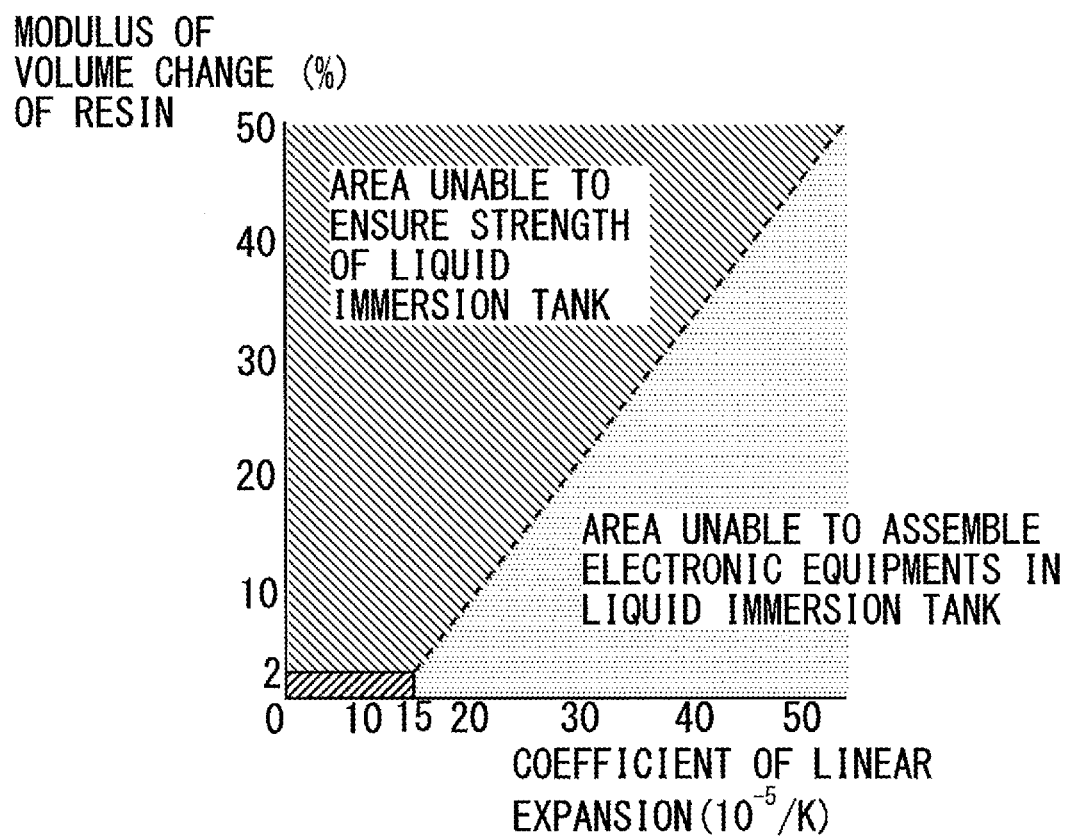
FIG. 7 is a graph quantitatively illustrating a condition for selecting the resin.
FIG. 8 is a diagram illustrating one example of a conformity result of materials of the liquid immersion tank.

FIG. 7 is a graph quantitatively illustrating a condition for selecting the resin. The electronic equipment 9 that has the fixed holes at 465 mm intervals, is received within the liquid immersion tank 1 with the coolant changing in temperature of 0° C. through 60° C., in which case a resin not conforming to the resin composing the tank body 2 is a resin that is larger than 2% in the modulus of volume change in the state of being immersed in the fluorine-series insulating coolants, or a resin that is larger than $15 \times 10^{-5}$/K in the coefficient of linear expansion. A table in FIG. 8 indicates a result of examining materials conforming to the material of the tank body 2 by manufacturing the test piece 21 with the variety of resins and performing the acceleration test.

Candidates for the resin composing the tank body are exemplified by PVC (polyvinyl chloride), PP (polypropylene), PE (polyethylene), ABS (acrylonitrile butadiene styrene), PPO (polyphenylene oxide), PPS (polyphenylene sulfide), PC (polycarbonate), PMMA (polymethylmethacrylate), polystyrol, epoxy glass, nylon 6, nylon 66, phenol, PTFE (polytetrafluoroethylene), FEP (fluorinated ethylene propylene), etc. It was confirmed that at least PVC and PE of these materials were applicable as the materials composing the tank body 2. As a matter of course, the tank body 2 disclosed in the present embodiment is not limited to the tank body composed of PVC or PE. Any type of resin material can be applied, which is equal to or smaller than 2% in the modulus of volume change on the occasion of being immersed in the fluorine-series insulating coolants and is equal to or smaller than $15 \times 10^{-5}$/K in the coefficient of linear expansion.

In the electronic equipment instanced by the server installed at a data center, there are increased an integration density of an integrated circuit to be mounted and a packaging density of electronic components, and a data size to be processed augments. In this respect, the cooling system 19 described above enables the cooling at higher efficiency than an air cooling system because of cooling the electronic equipments 9 by immersing the electronic equipments in the liquid coolants, and also enables a reduction of electric power to be consumed for cooling the electronic equipments 9.

The liquid immersion tank 1 used in the cooling system 19 described above employs the resin-made tank body 2, and can be therefore reduced in weight by far more significantly than using a metallic tank body. For example, when a tank body equivalent to the metallic tank body having a weight of about 200 kg is composed of the resin, the weight can be reduced down to about a half weight, i.e., 60 kg or less. The liquid immersion type cooling system involves using the liquid coolants and is therefore desired to take consideration of a withstand load on a floor surface for the installation. For example, the withstand load of a floor of an office-oriented building is 200 kg/m$^2$ against 1000 kg/m$^2$ that is the withstand load of a floor of a building used as the data center. The cooling system is therefore desired to be reduced in weight. The liquid immersion tank 1 described above, of which the tank body 2 is by far lighter in weight than the conventional tank bodies, can be therefore installed on the floor that is relatively low of the withstand load.

In the electronic equipment instanced by a server installed at a data center, there are increased an integration density of an integrated circuit to be mounted and a packaging density of electronic components, and a data size to be processed augments. For these reasons, a heat generation rate of the electronic equipment continues to rise, and it is desired to actually attain an efficient cooling technology. A method of cooling the electronic equipment is exemplified by a forced-air cooling method using a cooling fan that has been employed for many years and, in addition, a liquid immersion cooling method of immersing the electronic equipment in liquid coolants that has accelerated its development in recent years.

There are various types of coolants for liquid-cooling the electronic equipment immersed in a liquid. For example, a fluorine-series insulating coolant is instanced as a coolant having an insulating property and a high heat transport efficiency but not substantially remaining in the electronic equipment pulled out of a liquid immersion tank. The fluorine-series insulating coolants have a variety of specific gravities (e.g., 1.8 g/cm$^2$). But, each of the fluorine-series insulating coolants has larger specific gravity than that of water. Hence, the liquid immersion tank self-containing the electronic equipment and filled with the fluorine-series insulating coolant is relatively large in weight as an object installed in a building. However, a floor of the building has a prescribed upper limit of withstand load. The liquid immersion tanks are therefore desired to be lower in weight, depending on a number of liquid immersion tanks to be installed and a size of each liquid immersion tank.

Metals, resins and other various materials are considered as materials composing the tanks accumulating the liquids. The liquid immersion tank is, however, desired to withstand a load of the accumulated coolant and keep dimensional accuracy of a portion that fixes the self-contained electronic equipment. It is therefore considered to adopt the metal instanced by a stainless steel suitable for keeping the dimensional accuracy while withstanding the load of the coolant. However, amass of the metal is larger than amass of the resin, and hence the liquid immersion tank described above is hard to be decreased in weight.

Under such circumstances, the present application discloses a liquid immersion tank capable of, though made of a resin, withstanding a load of a coolant and keeping dimensional accuracy.

The liquid immersion tank and the apparatus having the liquid immersion tank are capable of, though made of the resin, withstanding the load of the coolant and keeping the dimensional accuracy.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A liquid immersion tank comprising:
   a tank body accommodating electronic equipment and storing a fluorine-series insulating coolant; and
   a fixing portion provided with an inner surface of the tank body, wherein the fixing portion fixes the electronic equipment in the tank body,
   wherein when a temperature of the fluorine-series insulating coolant changes from 0° C. to 60° C., heating a resin material of the fixing portion in the tank body and causing the fluorine-series insulating coolant to permeate into the resin material, the resin material has a coefficient of linear expansion equal to or smaller than $15 \times 10^{-5}$/K and a volume change of the resin material is equal to or smaller than 2%.

2. The liquid immersion tank according to claim 1, wherein the fixing portion is provided with two sides taking a face-to-face relationship in the inner surface, and
   the electronic equipment is fixed to the fixing portion provided with the two sides in the inner surface.

3. The liquid immersion tank according to claim 1, further comprising a rib formed on an outer surface of the tank body in a crosswise direction.

4. The liquid immersion tank according to claim 1, wherein the tank body has an opening enabling insertion and removal of the electronic equipment from upward, and
   the fixing portion is provided along the opening.

5. An apparatus comprising:
   electronic equipment; and
   a liquid immersion tank which includes a tank body and a fixing portion, wherein
   the tank body accommodates the electronic equipment and stores a fluorine-series insulating coolant,
   the fixing portion is provided with an inner surface of the tank body and fixes the electronic equipment in the tank body, and
   when a temperature of the fluorine-series insulating coolant changes from 0° C. to 60° C., heating a resin material of the fixing portion in the tank body and causing the fluorine-series insulating coolant to permeate into the resin material, the resin material has a coefficient of linear expansion equal to or smaller than $15 \times 10^{-5}$/K and a volume change of the resin material is equal to or smaller than 2%.

6. The apparatus having the liquid immersion tank according to claim 5, wherein the fixing portion is provided with two sides taking a face-to-face relationship in the inner surface, and
the electronic equipment is fixed to the fixing portion provided with the two sides in the inner surface.

7. The apparatus having the liquid immersion tank according to claim 5, further comprising a rib formed on an outer surface of the tank body in a crosswise direction.

8. The apparatus having the liquid immersion tank according to claim 5, wherein the tank body has an opening enabling insertion and removal of the electronic equipment from upward, and
the fixing portion is provided along the opening.

* * * * *